United States Patent [19]

Hall

[11] Patent Number: 5,233,129

[45] Date of Patent: Aug. 3, 1993

[54] SEISMIC NETWORK BAY FRAME

[75] Inventor: James R. Hall, Dracut, Mass.

[73] Assignee: AT&T Bell Laboratories, Murray Hill, N.J.

[21] Appl. No.: 961,566

[22] Filed: Oct. 15, 1992

[51] Int. Cl.$^5$ .............................................. H05K 5/00
[52] U.S. Cl. .................................. 174/52.1; 174/51; 361/724
[58] Field of Search ................ 174/50, 51, 52.1, 35 R, 174/35 MS; 220/4.02, 4.03; 361/380, 390, 391, 417, 418, 419

[56] References Cited

U.S. PATENT DOCUMENTS

| | | | |
|---|---|---|---|
| 2,185,562 | 1/1940 | Nielsen | 174/52.1 |
| 3,360,752 | 12/1967 | Uptegraff, Jr. | 174/52.1 |
| 3,760,314 | 9/1973 | Krasienko et al. | 174/52.1 |

Primary Examiner—Leo P. Picard
Assistant Examiner—Bot L. Ledynh
Attorney, Agent, or Firm—Thomas Stafford

[57] ABSTRACT

The invention addresses both the seismic and electromagnetic emissions requirements in the area of the frame where the upright frame members and the top frame member and base frame member are interconnected. To this end, the top frame member has two offset extensions on each end which interlock with interior surfaces of the upright frame members by projecting through notches in the upper portion of the upright frame members. The upright frame members and the top frame member are then welded together and the other outer surfaces of the welded members are ground flush to provide smooth continuous planar electromagnetic interference (EMI) gasket mating surfaces. An additional reinforcing offset member is positioned against and along each end of the top frame member in the area which engages the interior wide flange portion of each of the upright frame members. These additional reinforcing offset members project through notches in both the top frame member and the corresponding upright frame members. The reinforcing offset members are fillet welded to both the top frame member and the upright frame members. Another additional reinforcing angle member is attached to each of the upright frame members in the area of their bottom internal wide flanges and are fillet welded to the corresponding upright frame members. The upright frame members are welded to the base frame member and the outer surface of the welds is ground flush to provide smooth continuous planar EMI gasket mating surfaces.

8 Claims, 4 Drawing Sheets

SEISMIC NETWORK BAY FRAME

TECHNICAL FIELD

This invention relates to electronic equipment frames and, more particularly, to earthquake-resistant frames for electronic equipment.

BACKGROUND OF THE INVENTION

Communications and other electronic products are often mounted in welded steel frame structures which have large height to width and height to depth ratios. The frame structures are often structurally secured only to the floor of a building and often have fundamental resonant frequencies within the bandwidth which contains high levels of seismic motion. The frames must be constructed with sufficient rigidity to resist permanent damage and/or damage to the frame mounted electronic equipment which could be caused by a resonant response to a seismic event.

In addition, requirements are often encountered which dictate certain maximum levels of electromagnetic emissions from the electronic equipment. This often leads to the use of electromagnetic emissions mitigating gasketed metal doors and covers mated against smooth planar exterior frame surfaces. Prior known electronic equipment frames employed external overlapping tabs at the interconnections between vertical upright frame members and the top frame member and/or base frame member of the equipment frame. Use of these overlapping tabs resulted in a non-smooth external surface which did not lend itself to use of such electromagnetic emissions mitigating gasketed doors and covers.

SUMMARY OF THE INVENTION

The invention addresses both the seismic and electromagnetic emissions requirements in the area of the frame where the upright frame members and the top frame member are interconnected. In accordance with the invention, the top frame member has two offset extensions on each end which interlock with interior surfaces of the upright frame members by projecting through notches in the upper portion of the upright frame members. The upright frame members and the top frame member are then welded together and the outer surfaces of the welded frame members are ground flush to provide smooth continuous planar electromagnetic interference (EMI) gasket mating surfaces.

In an exemplary embodiment of the invention, an additional reinforcing offset member is positioned against and along each end of the top frame member in the area which engages the interior wide flange portion of each of the upright frame members. These additional reinforcing offset members project through notches in both the top frame member and the corresponding upright frame members. The reinforcing offset members are fillet welded to both the top frame member and the upright frame members.

In another exemplary embodiment of the invention, additional reinforcing angle members are attached to each of the upright frame members in the area of their bottom internal wide flanges and are fillet welded to the corresponding upright frame members. The upright frame members and the base frame member are then welded together and the outer surfaces of the welded frame members are ground flush to provide smooth continuous planar EMI gasket mating surfaces.

DETAILED DESCRIPTION

Figure 1:
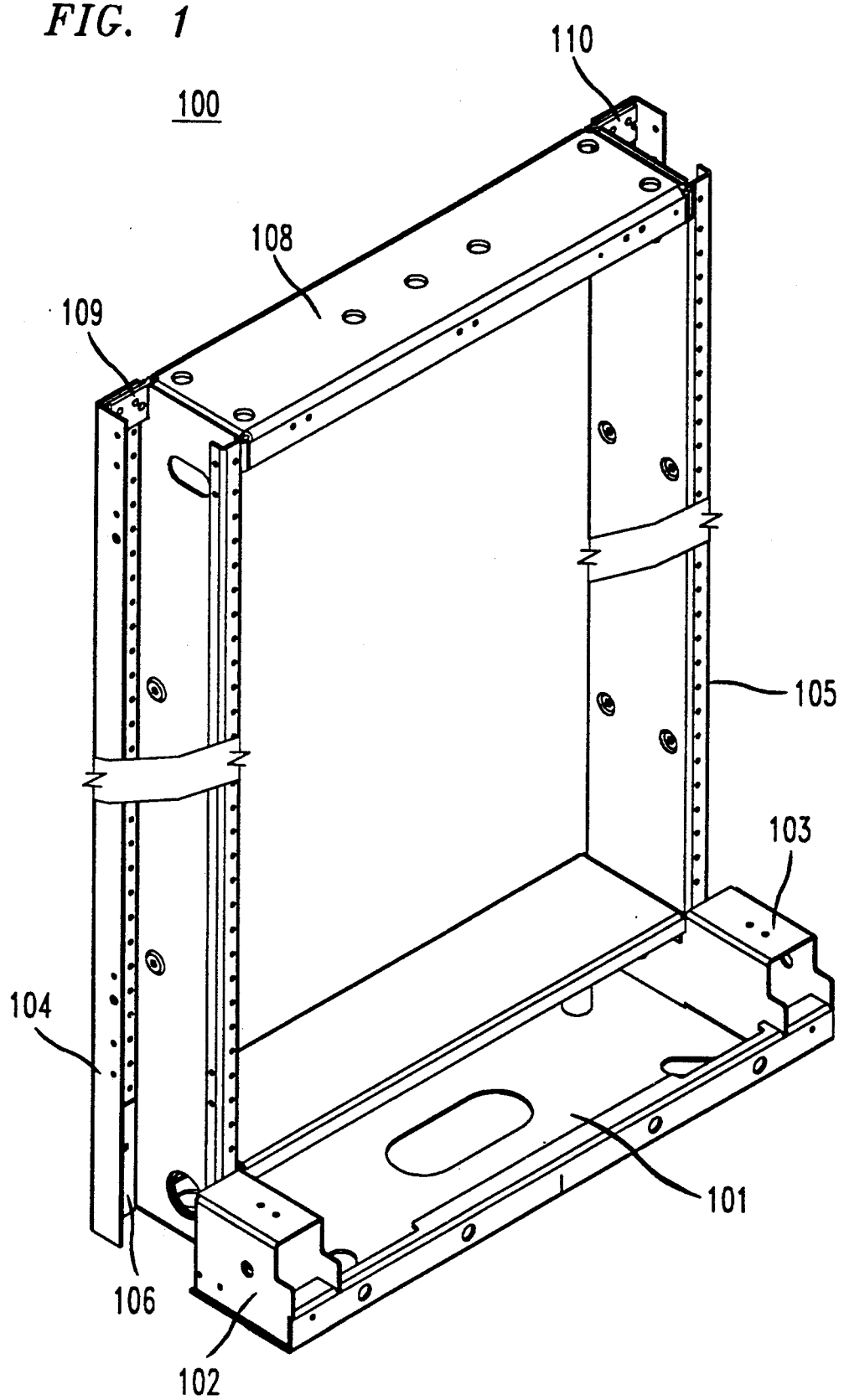
FIG. 1 shows a seismic network bay frame including the invention.

FIG. 1 is a perspective view of seismic network bay frame 100 including an embodiment of the invention. Specifically, frame 100 includes base frame member 101, gussets 102 and 103, upright frame members 104 and 105, reinforcing angle member 106 (reinforcing angle member 107 is not shown in this view), top frame member 108 and offset reinforcing members 109 and 110. The offset extensions of top frame member 108 are not clearly shown in FIG. 1. Gussets 102 and 103 and upright frame members 104 and 105 are secured by fillet welding to each end of base frame member 101 and to each other in well known fashion. Reinforcing angle members 106 and 107 are also secured by fillet welding to upright frame members 104 and 105 respectively, at the bottom internal wide flange area, in known fashion, as will be described below in relation to FIGS. 6 and 7. These reinforcing angle members 106 and 107 provide additional structural stiffness to bay frame 100, in accordance with an aspect of the invention. Upright frame members 104 and 105 are secured to top frame member 108 in a manner to be described below.

Figure 2:
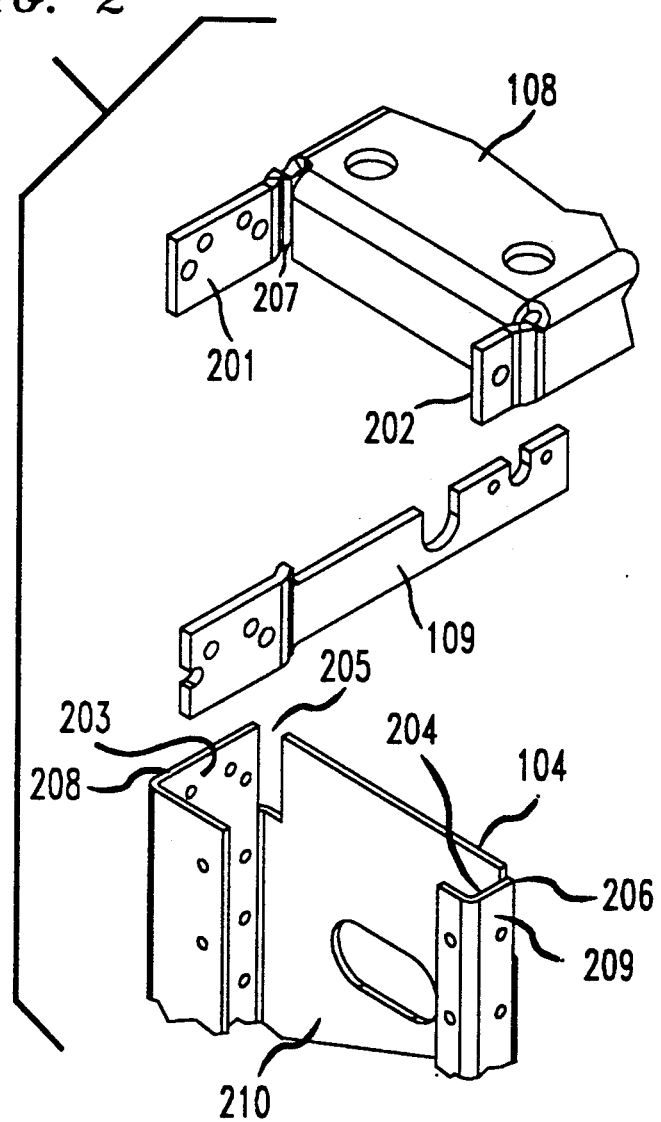
FIG. 2 is an exploded view of the top frame member and the upright frame members of the seismic network bay frame illustrating elements of the invention.

FIG. 2 is an exploded view of the interconnection of one end of top frame member 108, offset reinforcing member 109 and upright frame member 104. Upright frame member 104, a cross-section comprising a wide flange 208, a narrow flange 209 and a central portion 210 extending there between. It is noted that the other end of top frame member 108 is interconnected with offset reinforcing member 110 and upright frame member 105 in mirror form as the end shown in FIG. 2. Additionally, upright frame member 105 is a mirror form of frame member 104 and offset reinforcing member 110 (not shown) is a mirror form of offset reinforcing member 109. Specifically, top frame member 108 has offset extensions 201 and 202 which interconnect, in accordance with the invention, to interior surfaces 203 and 204 of wide flange 208 and narrow flange 209, respectively, of upright frame member 104 through notches 205 and 206, respectively. The use of the offset extensions 201 and 202 provide additional rigidity, in accordance with the invention, to the area of the interconnection of top frame member 108 to upright frame members 104 and 105. Also shown is offset reinforcing member 109 which is positioned against top frame member 108 through notch 207 and notch 205 of upright frame member 104. Offset reinforcing member 109 provides additional rigidity to the area of the interconnection of top frame 108 and upright frame member 104, in accordance with the invention. Note that offset extensions 201 and 202 of top frame member 108 are contoured such that they fit flush against interior surfaces 203 and 204, respectively, and so that the external surfaces of top frame member 108 and the external surfaces of wide flange 208 and narrow flange 209 of upright frame member 104 are in the same physical plane. This ensures that when these external surfaces are welded and ground flush, as described below, smooth planar continuous EMI gasket mating surfaces are provided, in accordance with the invention. Also note that the offset of offset reinforcing member 109 is contoured so that offset reinforcing member 109 fits flushly against and along the interior of top frame member 108. As described below, the interconnections of members 104, 108 and 109 are secured by fillet welding. Again, the other end of top frame member 108, (not shown) is interconnected with upright frame member 105 and offset reinforcing member 110 in mirror form of that shown in FIG. 2.

Figure 3:
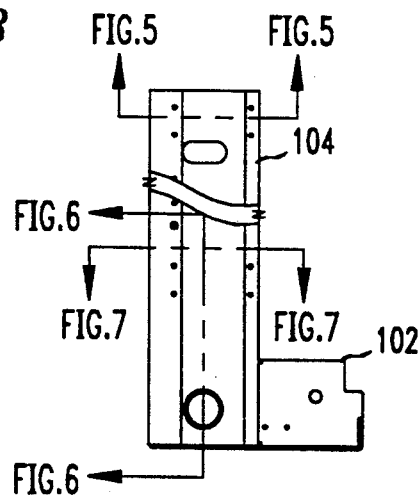
FIG. 3 is a view illustrating the positions on the seismic network bay frame where the cross-sectional views of FIG. 5, FIG. 6 and FIG. 7 are taken which illustrate aspects of the invention.

FIG. 3 illustrates the positions on frame 100 for taking the cross-sectional views shown in FIGS,. 5, 6 and 7.

Figure 4:
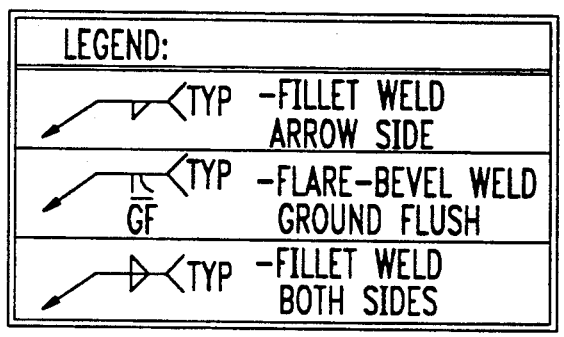
FIG. 4 is a table in which the weld symbols shown in FIGS. 5 and 6 are defined.
Figure 5:
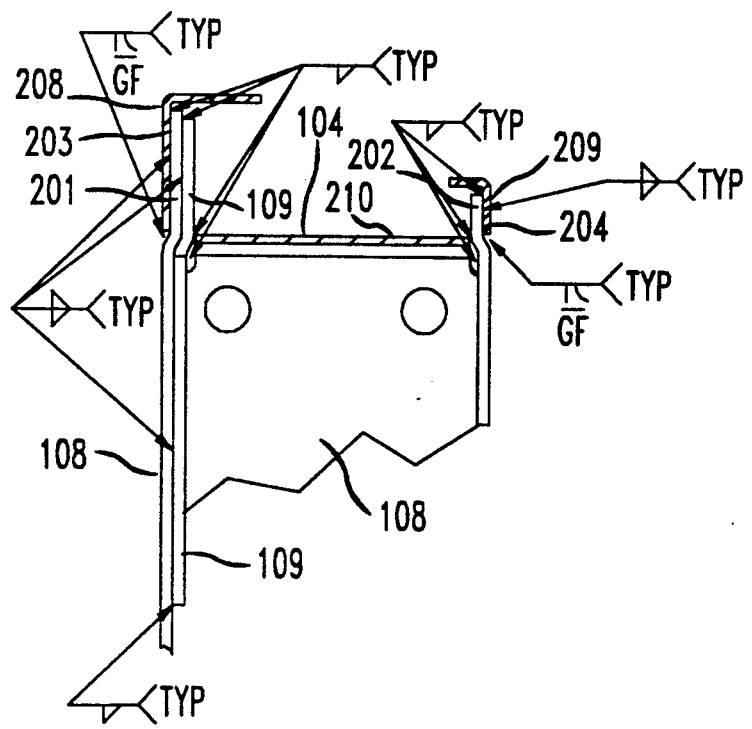
FIG. 5 is a cross-sectional view of the interconnection of the top frame member with one upright frame member and one offset reinforcing member of the seismic network bay frame.
Figure 6:
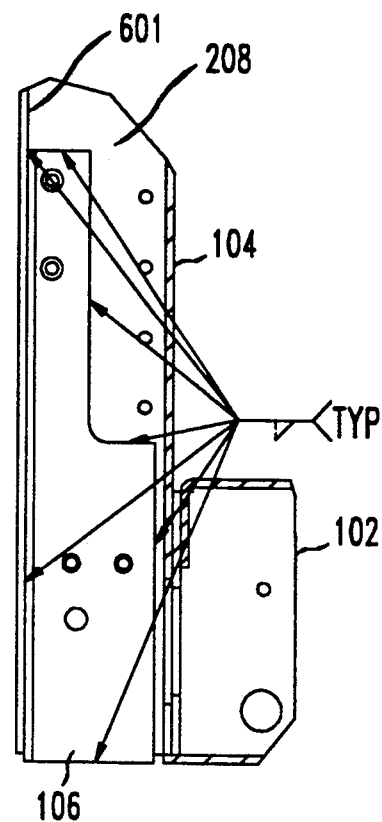
FIG. 6 is a first cross-sectional view of the interconnection of one of the reinforcing angle members with one of the upright frame members.

FIG. 4 is a table of symbols identifying the types of welds shown in FIGS. 5 and 6. That is, whether the weld is (a) a fillet weld arrow side of the member only; (b) a flare-bevel weld ground flush on the arrow side of the member, or (c) a fillet weld on both sides of the member. Such weld types are well known in the art, see for example, *Mechanical Engineering Design*, J. E. Shigley, Third Edition, McGraw-Hill, 1977, pages 275-279.

FIG. 5 shows a cross-sectional view of the interconnection of one end of top frame member 108, upright frame member 104 and offset reinforcing member 109 when assembled in accordance with the invention. Surfaces and elements shown in FIG. 5 are similarly numbered to those shown in FIG. 2 and will not be described again in detail. Additionally, shown in FIG. 5 are the welds securing members 104, 108 and 109 together. Specifically, offset extension 201 of top frame member 108 is fillet welded to inner surface 203 of wide flange 208 while offset extension 202 is fillet welded to inner surface 204 of narrow flange 209 of upright frame member 104, as shown. Offset reinforcing member 109 is fillet welded to both upright frame member 104 and top frame member 108, as shown. It is noted that the areas of the flare-bevel welds of the exterior surfaces of offset extensions 201 and 202 and upright frame member 104 are ground flush, as indicated in FIG. 5. This provides smooth, continuous planar exterior surfaces between top frame member 108 and upright frame members 104 and 105, in accordance with the invention, for EMI gasketed doors and covers for frame 100. Again, the interconnection of members 105, 108 and 110 is a mirror form of the interconnection shown in FIG. 5. It should be noted that, in this example, the indicated welds are made along the intersections of the frame members. It will also be apparent that similar welds are made along other intersections of top frame member 108 and upright members 104 and 105 which have not been shown because they are not part of the invention. This also applies to other members of frame 100, as will be apparent to those skilled in the art.

FIG. 6 shows a cross-sectional view of the interconnection of reinforcing angle member 106 to wide flange 208 and return flange 602 of upright frame member 104 and the fillet welds used to secure it thereto. The interconnection of reinforcing angle member 106 is secured as shown to the bottom of upright frame member 104 and provides additional structural stiffness in that area to frame 100 in accordance with an aspect of the invention. In this example, the fillet welds are along the intersection of reinforcing angle member 106 and wide flange 601 and return flange 602, as shown. Again, the interconnection of reinforcing angle member 107 (not shown) to upright frame member 105 is a mirror form to that shown in FIG. 6 regarding reinforcing angle member 106 and upright member 104.

Figure 7:
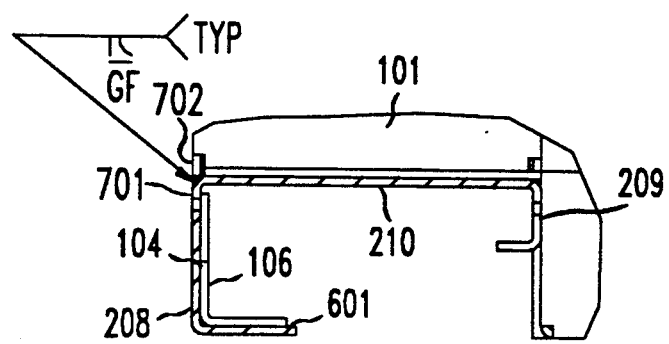
FIG. 7 is another cross-sectional view of the interconnection of the reinforcing angle member with the upright frame member of FIG. 6.

FIG. 7 is another cross-sectional view showing the placement of reinforcing angle member 106 relative to wide flange 208 and return flange 602 of upright frame member 104. Additional rigidity provided by the reinforcing angle member 106 is sufficient to avoid the need for overlapping tabs between base frame member 101 and upright frame member 104 on the external side of upright frame member 104 in the area of wide flange 108. The external surface 701 of the wide flange 208 of upright frame member 104 and external surface 702 of base frame member 101 are thus positioned in the same physical plane. This ensures that when these surfaces are flare-bevel welded and ground flush, as indicated in FIG. 7, smooth planar continuous EMI gasket mating surfaces are provided, in accordance with the invention. Again, the placement and interconnection of reinforcing member 107 (not shown), upright frame member 105 and base frame member 101 are a mirror for of that shown in FIG. 7.

The above described arrangements are, of course, merely illustrative of the application of the principles of the invention. Other arrangements may be devised by those skilled in the art without departing from the spirit or scope of the invention.

I claim:

1. A seismic network bay frame comprising:
   a base frame member;
   first and second upright frame members secured to and extending upwardly from the base frame member, each of the upright frame members having a wide flange, a narrow flange and a central portion extending there between, the central portion having first and second notches therein at its upper end, the first notch being adjacent to the wide flange and the second notch being adjacent to the narrow flange; and
   a top frame member having first and second off-set extensions on each end thereof, each first off-set extension being contoured such that it fits through the first notch to mate against an interior surface of the wide flange so that the exterior surface of the wide flange and the corresponding exterior surface of the top frame member are in the same physical plane, each second off-set extension being contoured such that it fits through the second notch to mate against an interior surface of the narrow flange so that the exterior surface of the narrow flange and a corresponding exterior surface of the top frame member are in the same physical plane.

2. The seismic network bay frame as defined in claim 1, wherein the interconnections of said first and second off-set extensions of said top frame member are fillet welded to the corresponding interior surfaces of said upright frame members.

3. The seismic network bay frame as defined in claim 2, wherein the interconnections of said first and second off-set extensions of said top frame member with said upright frame members are flare-bevel welded and the welds are ground flush to provide smooth, continuous planar electromagnetic interference gasket mating exterior surfaces.

4. The seismic network bay frame as defined in claim 1, further including first and second off-set reinforcing members, each contoured to mate with the first off-set extensions at each end of said top frame member and to extend along an interior surface of said top frame member.

5. The seismic network bay frame as defined in claim 4, wherein the interconnections of offset extensions to said upright frame members and said off-set reinforcing members to said top frame member are secured by fillet welds.

6. The seismic network bay frame as defined in claim 4, wherein each of said upright frame members includes a return flange extending from said wide flange and further including first and second angle reinforcing members secured to the wide flange and return flange at the bottom of each of said first and second upright frame members, respectively.

7. The seismic network bay frame as defined in claim 6, wherein the interconnections of said offset extensions to said upright frame member, said offset reinforcing members to said top frame member and said angle reinforcing members to said upright frame members are secured by fillet welds.

8. The seismic network bay frame as defined in claim 7, further including between said upright frame members and said base frame member flare-bevel welds ground flush to external surfaces of said m embers to provide smooth, continuous planar electromagnetic interference gasket mating surfaces.

* * * * *